United States Patent
Haratipour et al.

(10) Patent No.: US 11,626,475 B2
(45) Date of Patent: Apr. 11, 2023

(54) TRENCH CAPACITOR WITH EXTENDED DIELECTRIC LAYER

(71) Applicant: INTEL CORPORATION, Santa Clara, CA (US)

(72) Inventors: Nazila Haratipour, Hillsboro, OR (US); Chia-Ching Lin, Portland, OR (US); Sou-Chi Chang, Portland, OR (US); Ian A. Young, Portland, OR (US); Uygar E. Avci, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 746 days.

(21) Appl. No.: 16/441,905

(22) Filed: Jun. 14, 2019

(65) Prior Publication Data

US 2020/0395435 A1 Dec. 17, 2020

(51) Int. Cl.
*H01L 21/02* (2006.01)
*H01L 49/02* (2006.01)
*H01G 4/018* (2006.01)
*H01L 23/64* (2006.01)

(52) U.S. Cl.
CPC ............. *H01L 28/60* (2013.01); *H01G 4/018* (2013.01); *H01L 23/642* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,794,694 B2* | 9/2004 | Diodato | ............. | H01L 23/5223 257/295 |
| 8,716,100 B2* | 5/2014 | Tzeng | ..................... | H01L 28/40 438/396 |
| 2004/0043578 A1* | 3/2004 | Marsh | ..................... | H01L 28/75 257/E21.171 |
| 2004/0135186 A1* | 7/2004 | Yamamoto | ........ | H01L 27/10814 257/296 |
| 2006/0076600 A1* | 4/2006 | Nakabayashi | .... | H01L 27/10894 257/E27.087 |
| 2006/0234464 A1* | 10/2006 | Giraudin | ........... | H01L 29/66181 257/E21.59 |
| 2013/0075862 A1* | 3/2013 | Rennie | ................ | H01L 23/5223 257/532 |

* cited by examiner

*Primary Examiner* — Niki H Nguyen
(74) *Attorney, Agent, or Firm* — Schwabe, Williamson & Wyatt, P.C.

(57) ABSTRACT

An improved trench capacitor structure is disclosed that allows for the formation of narrower capacitors. An example capacitor structure includes a first conductive layer on the sidewalls of an opening through a thickness of a dielectric layer, a capacitor dielectric layer on the first conductive layer, a second conductive layer on the capacitor dielectric layer, and a conductive fill material on the second conductive layer. The capacitor dielectric layer laterally extends above the opening and along a top surface of the dielectric layer, and the conductive fill material fills a remaining portion of the opening.

25 Claims, 14 Drawing Sheets

TRENCH CAPACITOR WITH EXTENDED DIELECTRIC LAYER

BACKGROUND

As electronic devices continue to become smaller and more complex, the need to provide smaller and more robust energy storage components similarly grows. Trench capacitors have been utilized extensively due to their relatively small footprint and relative ease of integration with standard CMOS processing. Conductive layers separated by a dielectric layer are patterned within a trench to form the capacitor plates or electrodes. Many challenges exist when fabricating such devices to maintain a high capacitance while avoiding shorting between the capacitor plates, particularly as scaling continues.

BRIEF DESCRIPTION OF THE DRAWINGS

Features and advantages of embodiments of the claimed subject matter will become apparent as the following Detailed Description proceeds, and upon reference to the Drawings, in which:

Figure 1:
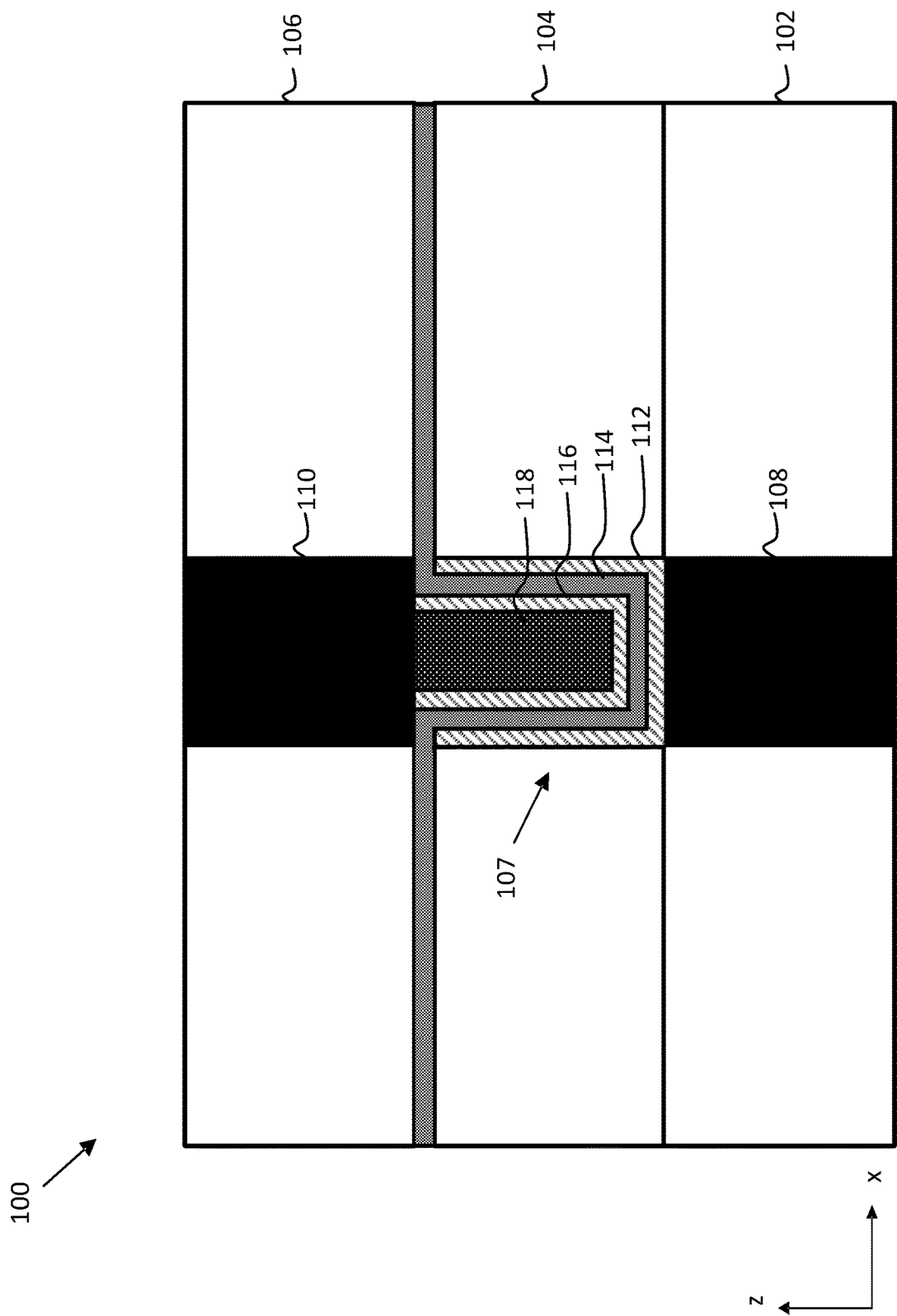
FIG. 1 illustrates a cross-section view of an integrated circuit structure that includes a trench capacitor, in accordance with some embodiments of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

A trench capacitor design is disclosed. The design is particularly well-suited for forming very narrow width trench capacitors that maximize capacitance over a small substrate footprint. An example embodiment includes a capacitor dielectric layer that extends out of the trench and along or otherwise above a top surface of an interlayer dielectric (ILD) layer that includes the trench capacitor. The capacitor dielectric layer acts as an insulating barrier between the two capacitor plates or electrodes even along the surface of the dielectric layer and/or at the upper corners of the trench. In some such cases, the lower capacitor electrode is completely within the trench and below the upper surface of the ILD layer, and the capacitor dielectric layer and possibly the upper capacitor electrode extend above the upper surface of the ILD layer. In any such cases, the portion of the capacitor dielectric layer that extends above the surface of the ILD layer effectively provides the benefit of allowing for a top contact having a wider width since the capacitor dielectric layer protects the bottom electrode from contacting the top contact and shorting the capacitor. Accordingly, the capacitor design is no longer limited by the size (e.g., width) of the contacts that are fabricated to contact each of the capacitor plates or electrodes. Numerous configurations and embodiments will be apparent.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some example embodiments, such tools may indicate the presence of the capacitor dielectric layer extending out of a trench and along or otherwise above a top surface of an interlayer dielectric (ILD) layer that includes the trench capacitor, as variously described herein. Numerous configurations and variations will be apparent in light of this disclosure.

General Overview

As noted above, a trench capacitor generally includes conductive layers separated by a dielectric layer patterned within a trench to form the capacitor electrodes. An issue that arises as scaling continues is that a contact that lands on the upper electrode can sometimes short to the lower electrode, thereby shorting the capacitor. One possible solution for mitigating such short-circuiting is to recess the bottom electrode of the trench capacitor, so as to increase the distance of the lower electrode from the contact. Unfortunately, non-uniformity of the etch can cause different recess lengths (depths) across the trench capacitors of a given wafer. This in turn causes a variability in capacitance across the wafer. Such variability may not be acceptable in all applications.

Thus, techniques and trench capacitor designs are provided herein to help eliminate or otherwise reduce issues that may otherwise limit the size of the capacitor. In an example embodiment, a fabrication methodology is provided that uses additional chemical mechanical polishing (CMP) processes along with sacrificial material to form unique layer structures inside and outside of the trenches. An example capacitor structure includes, for instance, a first conductive layer on the sidewalls of an opening through a thickness of a dielectric layer (e.g., and ILD layer), a capacitor dielectric layer on the first conductive layer, a second conductive layer on the capacitor dielectric layer, and a conductive fill material on the second conductive layer. The capacitor dielectric layer extends above the opening and is on a top surface of the ILD or other dielectric layer, and the conductive fill material fills a remaining portion of the opening. In some configurations, the second conductive layer extends above the opening by a distance equal to the thickness of the capacitor dielectric layer, such that the top surface of the second conductive layer is co-planar with the top surface of the capacitor dielectric layer. The conductive fill material may also be co-planar with the top surface of the second conductive layer and the top surface of the capacitor dielectric layer. In some such example cases, a contact lands on at least one of the conductive fill material and the second conductive layer, and may further land on the top surface of the capacitor dielectric layer.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y.

It should be readily understood that the meaning of "above" and "over" in the present disclosure should be interpreted in the broadest manner such that "above" and "over" not only mean "directly on" something but also include the meaning of over something with an intermediate feature or a layer therebetween. Additionally, the meaning of "on" in the present disclosure should be interpreted to mean directly on something (i.e., having no intermediate feature or layer therebetween.)

Further, spatially relative terms, such as "beneath," "below," "lower," "above," "upper," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer. In still other embodiments, a substrate may include multiple layers, such as a base layer (e.g., bulk silicon wafer), a single crystalline top layer (e.g., monocrystalline silicon), and a buried insulator layer (e.g., silicon dioxide) between the base and top layers. As will be appreciated, any number of substrate configurations can be used with the techniques provided herein.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer. A substrate can be a layer, can include one or more layers therein, and/or can have one or more layer thereupon, thereabove, and/or therebelow.

Trench Capacitor Architecture

FIG. 1 illustrates a cross-section view of an integrated circuit structure 100 that includes a trench capacitor, according to an embodiment. As can be seen, the capacitor may be formed within a stack of interlayer dielectric (ILD) layers above a substrate. Such ILD layers may also include interconnects (e.g., conductive via and lines) and/or any other patterned structures. A given capacitor may be within one ILD layer, or multiple consecutive or stacked ILD layers. In the latter case, note that the uppermost ILD layer will have the top surface along which the capacitor dielectric layer extends or is otherwise above. For example, structure 100 includes a first ILD or dielectric layer 102, a second ILD or dielectric layer 104, and a third ILD or dielectric layer 106 stacked one over another in the z-direction. Each of layers 102, 104, and 106 may comprise, for instance, common ILD dielectric materials such as silicon oxide, silicon nitride, and/or high-k dielectrics, as well as other materials such as liner and barrier layer materials (e.g., tantalum, tantalum nitride) and conductor materials (e.g., tungsten, copper, aluminum). In some embodiments, first dielectric layer 102 is replaced with a semiconductor substrate, for example, in situations where the capacitor is formed directly on the substrate surface or otherwise proximate a device layer. In such cases, note that the device layer may include, for instance, transistors and other components that are connected to conductive interconnect features within the ILD layers 102, 104, and 106. There may be a local interconnect between the device layer and the first ILD layer. The use of the terms "first," "second," and "third" with regards to the ILD layers 102, 104, and 106 is provided for illustrative purposes only and does not limit the location of the layers within a larger structure. Any number of ILD layers may be used in a chip that includes layers 102, 104, and 106, or just layer 104. The illustrated features are not intended to be drawn to scale.

Various capacitor layers may be formed within a trench 107 through second dielectric layer 104. Trench 107 may be any opening through a thickness of second dielectric layer 104. A first conductive contact 108 makes ohmic contact with a first capacitor electrode 112 within trench 107. First conductive contact 108 may be a metal via that is formed through a thickness of first dielectric layer 102. Similarly, a second conductive contact 110 makes ohmic contact with a second capacitor electrode 116 within trench 107. Second conductive contact 110 may be a metal via that is formed through a thickness of third dielectric layer 106. A capacitor dielectric layer 114 separates first electrode 112 from second electrode 116 within trench 107. A conductive fill material 118 is also provided to fill a remaining portion of trench 107 following deposition of the other capacitor layers. In some embodiments, conductive fill material 118 and second capacitor electrode 116 collectively represent the top capacitor electrode.

As can be further seen in FIG. 1, and according to some embodiments, capacitor dielectric layer 114 extends up out of trench 107 and along a top surface of ILD layer 104. Because capacitor dielectric layer 114 extends over the top of first capacitor electrode 112, second conductive contact 110 can have a greater width as it cannot create a short with first capacitor electrode 112. If capacitor dielectric layer 114 only remained in trench 107, then second conductive contact 110 would need to be narrower and more carefully aligned to ensure that ohmic contact is only made to second capacitor electrode 116 and/or conductive fill material 118. Further note in this example embodiment that the first capacitor electrode 112 is completely within the trench 107. In particular, the top surface of the first capacitor electrode 112 is co-planar with the top surface of the ILD layer 104. In addition, the top surface of capacitor dielectric layer 114 is co-planar with both the top surface of the second capacitor electrode 116 and the top surface of the conductive fill material 118. In other embodiments, note that the second capacitor electrode 116 may be recessed such that its top surface is below the top surface of capacitor dielectric layer 114. Alternatively, or in addition, note that the conductive fill material 118 may be recessed such that its top surface is below the top surface of capacitor dielectric layer 114. Such selective recessing of the second capacitor electrode 116 and/or the conductive fill material 118 may occur during the etch that forms second conductive contact 110. Further note that second conductive contact 110 may not land in a perfectly symmetrical fashion as shown. For instance, second conductive contact 110 may be offset to one side or the other of conductive fill material 118, so as to be only partially landed. So long as sufficient electrical contact is made, such partial landing may be acceptable.

Any number of capacitor structures may be formed within a given ILD layer or multi-ILD layer structure, or formed between multiple ILD layers. Further fabrication details including example materials for each layer are provided herein with reference to the example structures depicted in FIGS. 3-12.

Figure 2:
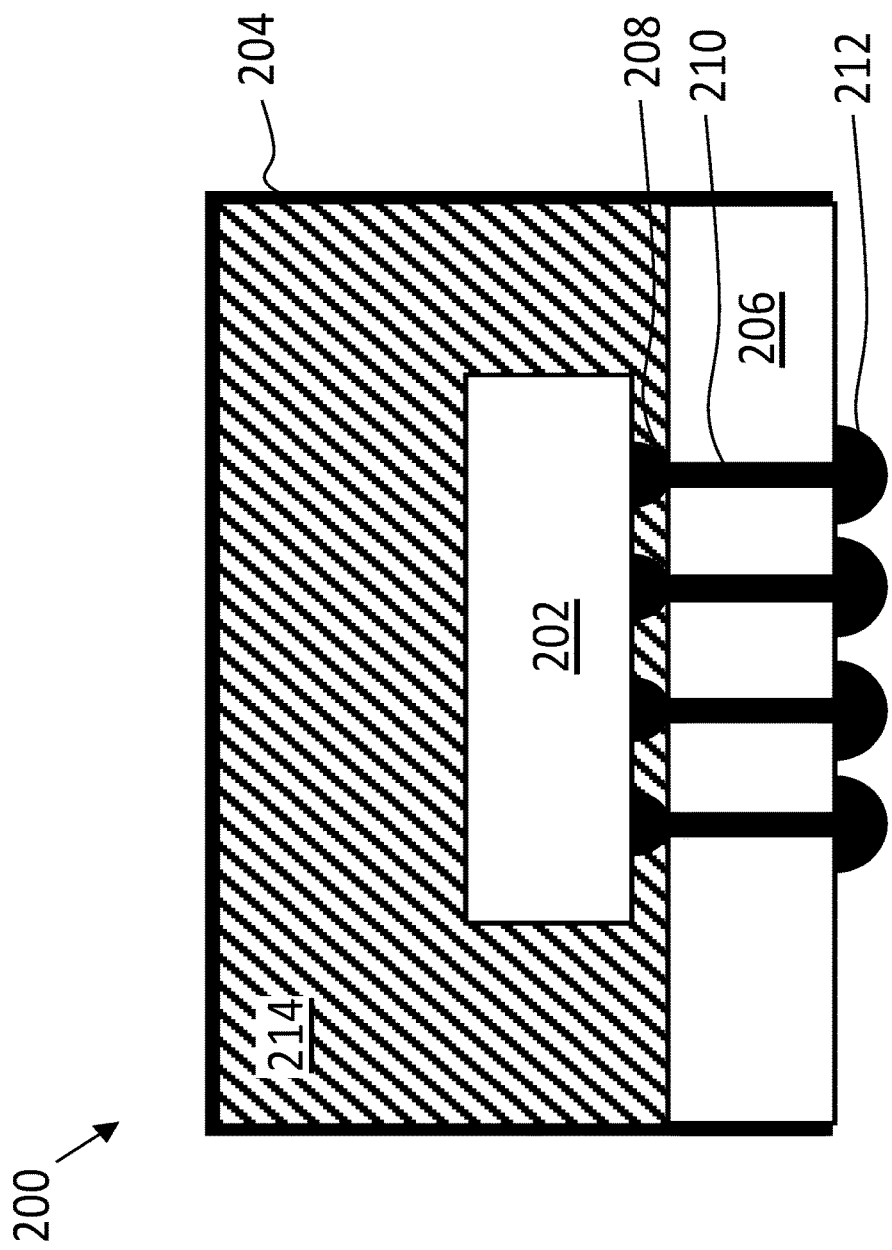
FIG. 2 illustrates a cross-section view of a chip package containing one or more semiconductor dies, in accordance with some embodiments of the present disclosure.

FIG. 2 illustrates an example embodiment of a chip package 200. As can be seen, chip package 200 includes one or more dies 202. One or more dies 202 may include at least one semiconductor chip having one or more capacitor structures, such as the one shown in integrated circuit structure 100. One or more dies 202 may include any other circuitry used to interface with other devices formed on the dies, or other devices connected to chip package 200, in some example configurations.

As can be further seen, chip package 200 includes a housing 204 that is bonded to a package substrate 206. The housing 204 may be any standard or proprietary housing, and provides, for example, electromagnetic shielding and environmental protection for the components of chip package 200. The one or more dies 202 may be conductively coupled to a package substrate 206 using connections 208, which may be implemented with any number of standard or proprietary connection mechanisms, such as solder bumps, ball grid array (BGA), pins, or wire bonds, to name a few examples. Package substrate 206 may be any standard or proprietary package substrate, but in some cases includes a dielectric material having conductive pathways (e.g., including conductive vias and lines) extending through the dielectric material between the faces of package substrate 206, or between different locations on each face. In some embodiments, package substrate 206 may have a thickness less than 1 millimeter (e.g., between 0.1 millimeters and 0.5 millimeters), although any number of package geometries can be used. Additional conductive contacts 212 may be disposed at an opposite face of package substrate 206 for conductively contacting, for instance, a printed circuit board. One or more vias 210 extend through a thickness of package substrate 206 to provide conductive pathways between one or more of connections 208 to one or more of contacts 212. Vias 210 are illustrated as single straight columns through package substrate 206 for ease of illustration, although other configurations can be used (e.g., damascene, dual damascene, through-silicon via). In still other embodiments, vias 210 are fabricated by multiple smaller stacked vias, or are staggered at different locations across package substrate 206. In the illustrated embodiment, contacts 212 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 212, to inhibit shorting.

In some embodiments, a mold material 214 may be disposed around the one or more dies 202 included within housing 204 (e.g., between dies 202 and package substrate 206 as an underfill material, as well as between dies 202 and housing 204 as an overfill material). Although the dimensions and qualities of the mold material 214 can vary from one embodiment to the next, in some embodiments, a thickness of mold material 214 is less than 1 millimeter. Example materials that may be used for mold material 214 include epoxy mold materials, as suitable. In some cases, the mold material 214 is thermally conductive, in addition to be electrically insulating.

Fabrication Procedure

FIGS. 3-12 illustrate cross-section views of different stages of a fabrication process for an integrated circuit structure that includes a trench capacitor, such as structure 100, according to some embodiments of the present disclosure. The various layers and structures illustrated in FIGS. 3-12 are not intended to be drawn to scale but are illustrated in a particular fashion for clarity. Some intermediate processes may be performed that are not explicitly illustrated, as will be appreciated (e.g., such as polishing and cleaning processes, or other standard processing). In other embodiments, not all illustrated layers are used and/or additional layers may be included.

Figure 3:
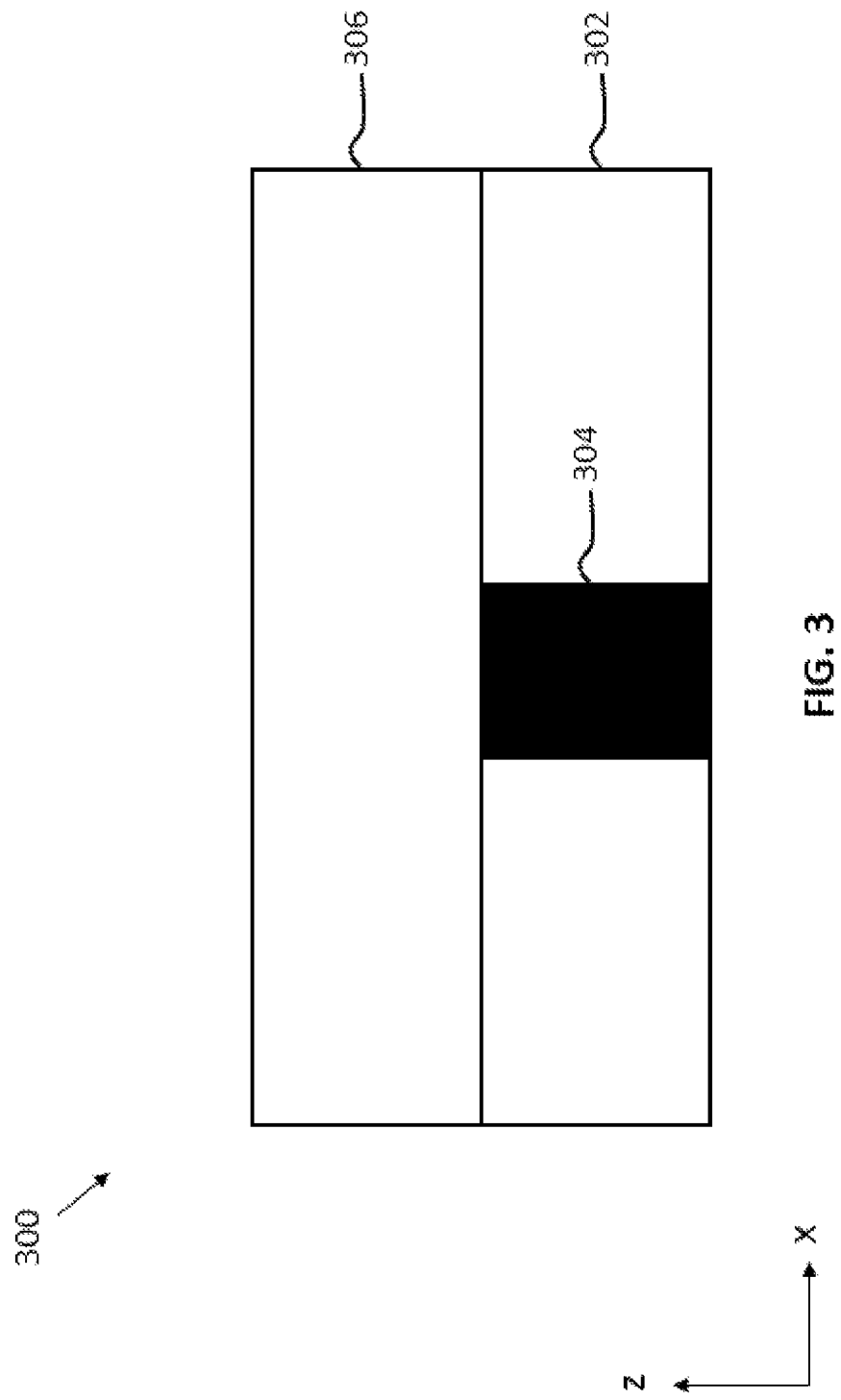
FIGS. 3-12 illustrate cross-section views of different stages in a fabrication process for the integrated circuit structure that includes the trench capacitor of FIG. 1, in accordance with some embodiments of the present disclosure.

FIG. 3 illustrates a first structure 300 in the fabrication process of a trench capacitor, according to an embodiment. Structure 300 includes a first dielectric layer 302 having a first conductive contact 304 disposed through a thickness of first dielectric layer 302, and a second dielectric layer 306 disposed over first dielectric layer 302. Although not illustrated, each of first dielectric layer 302 and second dielectric layer 306 may be deposited over a substrate, such as a semiconductor substrate. The substrate may be any suitable substrate material for forming additional material layers over it (e.g., bulk semiconductor substrate or a semiconductor-on-insulator substrate). In some embodiments, the substrate includes a semiconductor material such as silicon, germanium, silicon germanium, gallium arsenide, or indium phosphide. First dielectric layer 302 may be deposited directly on a surface of the substrate, or in other embodiments, first dielectric layer 302 is deposited over one or more other dielectric layers between it and the substrate.

Each of first dielectric layer 302 and second dielectric layer 306 may be any suitable ILD material. Examples of ILD materials include silicon oxide, silicon nitride, silicon oxynitride, carbon-doped silicon oxide, carbon-doped silicon nitride, polymers, and low-k dielectrics (e.g., porous versions of any of these). Each of first dielectric layer 302 and second dielectric layer 306 may be deposited using well-known physical vapor deposition (PVD) or chemical vapor deposition (CVD) techniques. Note that structure 300 may further include other features such as an etch stop layer (e.g., silicon nitride, silicon oxynitride, silicon carbide) between layers 302 and 306.

First conductive contact 304 may be generally any conductive material. Some examples of conductive materials to use for first conductive contact 304 include titanium nitride (TiN), titanium silicon nitride (TiSiN), tantalum nitride (TaN), titanium aluminum carbon nitride (TiAlCN), polysilicon (pSi), copper (Cu), aluminum (Al), gold (Au), tungsten (W), cobalt (Co), platinum (Pt), ruthenium (Ru), and iridium (Ir). First conductive contact 304 may be formed using well-known techniques (e.g., single damascene, dual damascene).

Figure 4:
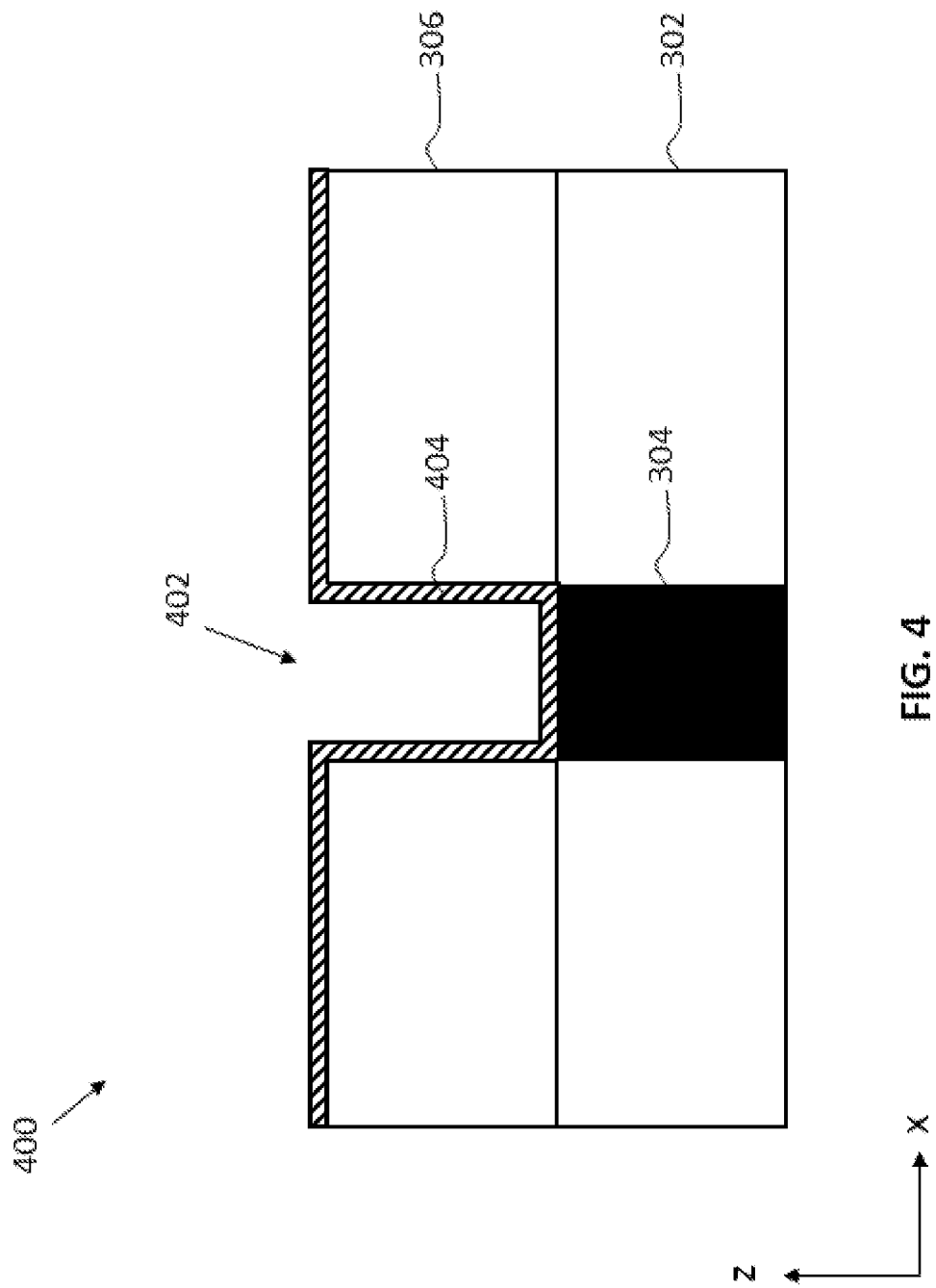

FIG. 4 illustrates another structure 400 in the fabrication process of a trench capacitor, according to an embodiment. An opening 402 is created through a thickness of second dielectric layer 306. Opening 402 may extend through the entire thickness of second dielectric layer 306. Opening 402 may be in the shape of a trench (extending along the y-direction) or hole, although any shape is possible. Trench or hole may be used interchangeably herein. A trench can be thought of as an elongated hole, and a hole can be thought of as a short trench. Thus, a hole can be a trench, and a trench can be a hole. Opening 402 may be created using standard lithography and etching techniques, such as reaction ion etching (RIE), to remove an unmasked portion of the material of second dielectric layer 306. In some embodiments, opening 402 has a width (in the x-direction) between about 50 nm and about 300 nm. Opening 402 is at least partially aligned such that it exposes at least a portion of first conductive contact 304. In some embodiments, opening 402 is aligned over the center of first conductive contact 304. In other embodiments, opening 402 is offset to one side from the center of first conductive contact 304 and thus only partially lands on first conductive contact 304.

Figure 5:
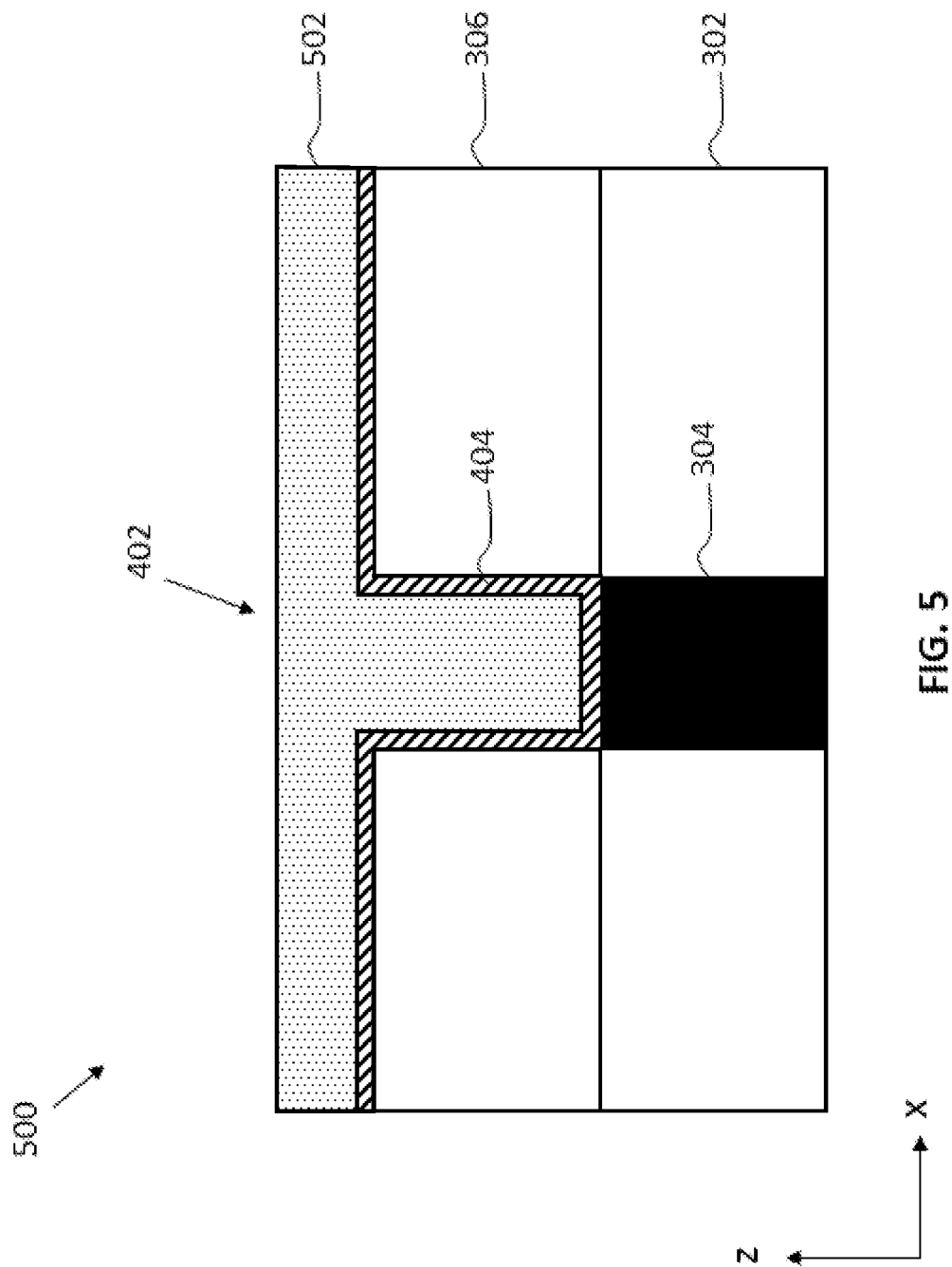

After forming opening 402, a first conductive layer 404 is deposited within opening 402 and on a top surface of second dielectric layer 306. In some embodiments, first conductive layer 404 is deposited using a substantially conformal deposition technique to ensure that the inner sidewalls of opening 402 are covered by first conductive layer 404. Such example techniques include, for instance, atomic layer deposition (ALD) and plasma-enhanced CVD. First conductive layer 404 may be deposited to a blanket thickness of, for example, between about 5 nm and 25 nm (e.g., 6 to 20 nm), although the thickness can vary from one embodiment to the next. First conductive layer 404 may be copper. In some embodiments, first conductive layer 404 may include any conductive material, such as TiN, TiSiN, TaN, TiAlCN, pSi, Al, Au, W, Co, Pt, Ru, RuO, Ir or IrO FIG. 5 illustrates another structure 500 in the fabrication process of a trench capacitor, according to an embodiment. As can be seen in this example case, structure 500 includes a sacrificial fill material 502 that is deposited to fill a remainder of opening 402, and also deposited over a top surface of dielectric layer 306. Sacrificial fill material 502 may be, for example, a carbon-based hardmask material, polymer material, or any dielectric material that is different than the material of second dielectric layer 306 and the first conductive layer 404, so as to allow for etch selectivity during subsequent removal of sacrificial fill material 502, as will be discussed in turn. Sacrificial fill material 502 may be deposited, for instance, using spin-on coating, CVD or PVD techniques. In some specific example embodiments, sacrificial fill material 502 is deposited using a spin-on technique and includes any carbon-based hard mask materials, any spin-on-glass (SOG) materials or any fillable oxides or nitrides. In some embodiments, sacrificial fill material 502 is porous or otherwise does not occupy the entirety of the space within opening 402 (e.g., voids may be present, whether such voids result unintentionally or as a natural part of the deposition process, or the voids are provided as intentional porosity to facilitate a particular etch rate).

Figure 6:
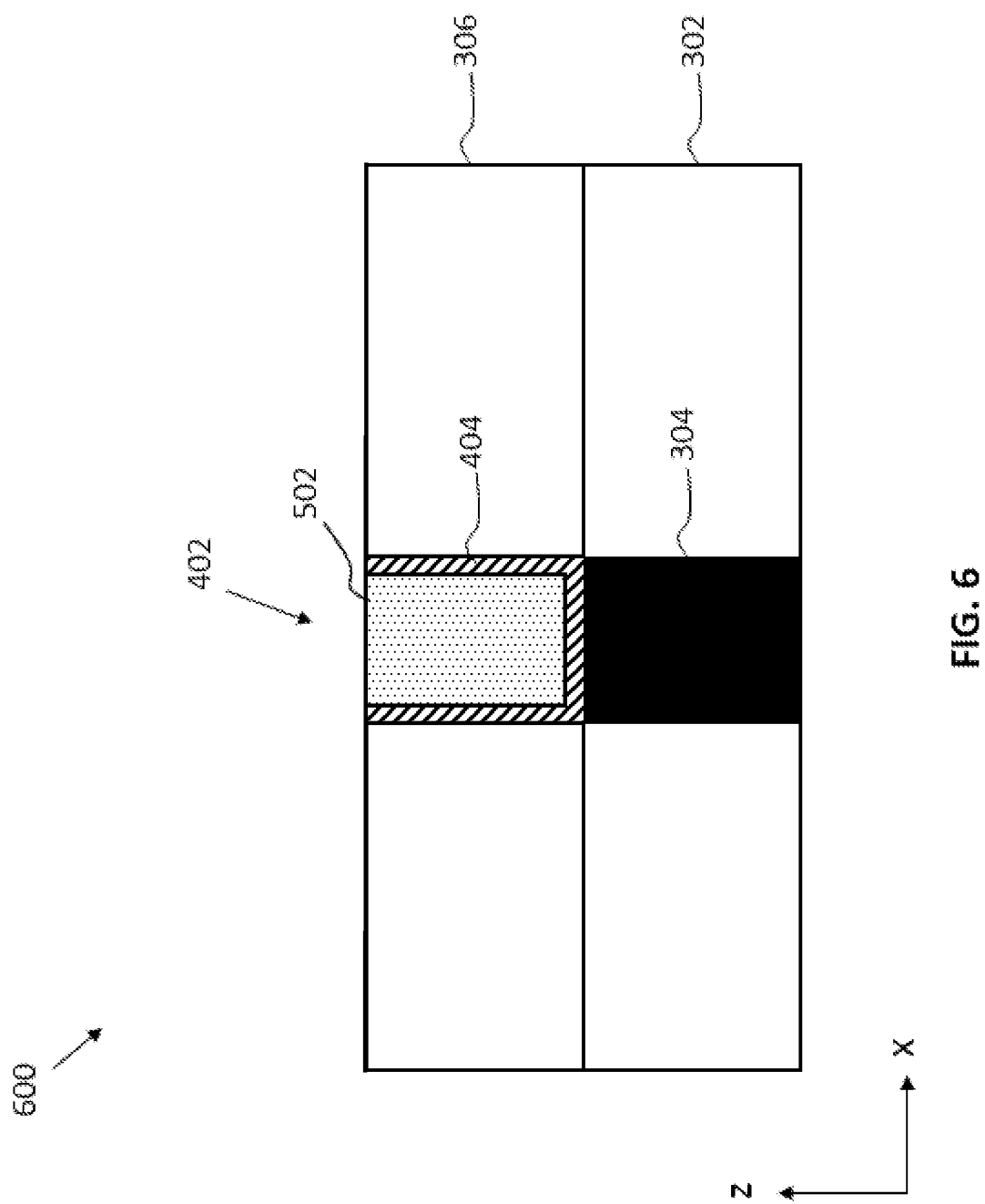

FIG. 6 illustrates another structure 600 in the fabrication process of a trench capacitor, according to an embodiment. In structure 600, portions of sacrificial fill material 502 and first conductive layer 404 that are above a top surface of second dielectric layer 306 have been removed. Thus, only portions of sacrificial fill material 502 and first conductive layer 404 within opening 402 remain after the removal process, according to an embodiment. An etching process using wet chemical etchants can be used to remove the exposed materials above opening 402. However, this etching process is difficult to control precisely and can result in accidental over-etching of first conductive layer 404 within opening 402. According to an embodiment, a CMP technique is used to remove portions of sacrificial fill material 502 and first conductive layer 404 above the top surface of second dielectric layer 306, thus forming a planarized surface. Using CMP to remove the excess materials outside of opening 402 improves uniformity across other similar capacitor devices on the substrate, and also ensures that first conductive layer 404 remains intact along the entire height of opening 402.

Figure 7:
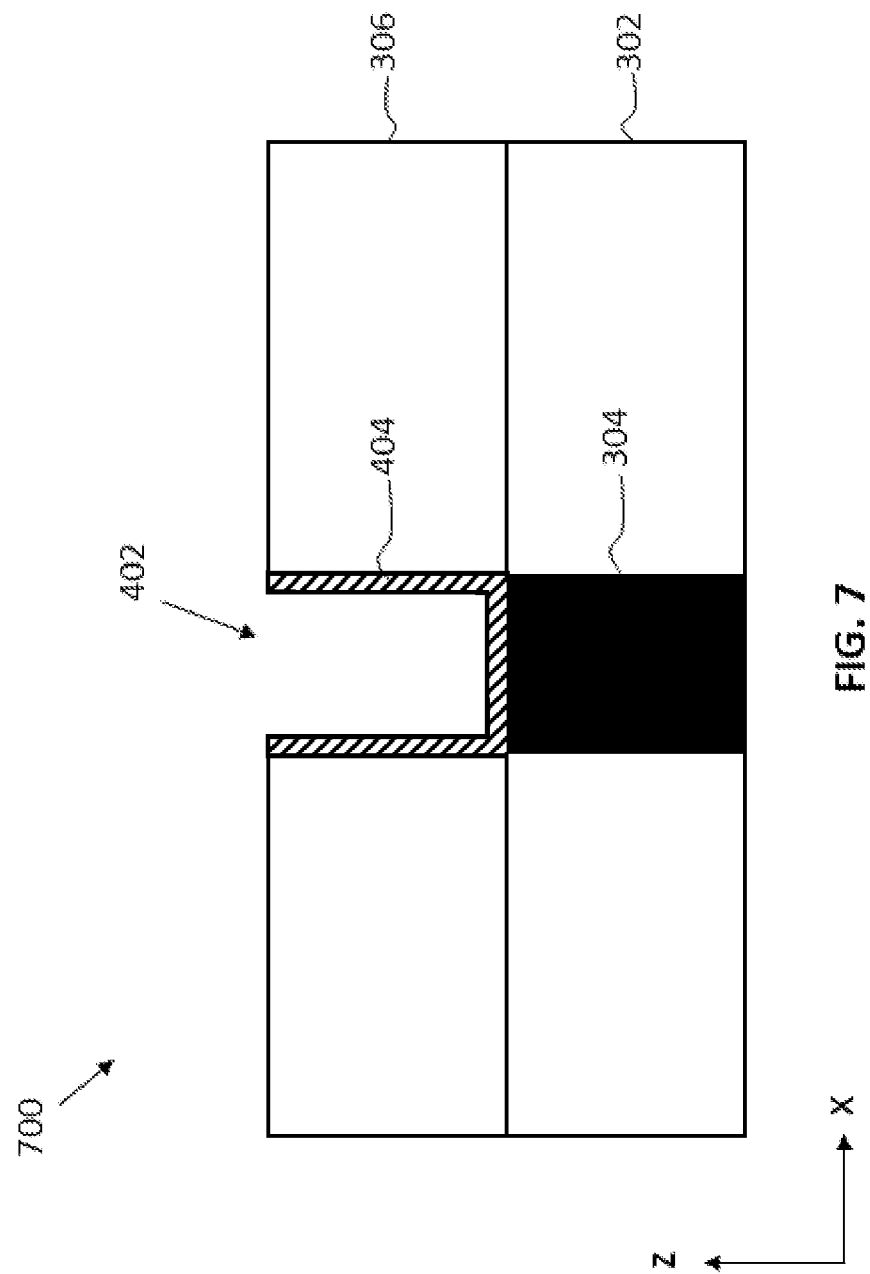

FIG. 7 illustrates another structure 700 in the fabrication process of a trench capacitor, according to an embodiment. Here, the remaining sacrificial fill material 502 inside of opening 402 is removed. Sacrificial fill material 502 may be removed using standard wet and/or dry etching processes. In some example embodiments, wet etchants that selectively etch the sacrificial fill material 502 compared to second dielectric layer 306 and the first conductive layer 404 are used. So, for instance, an etchant that is selective to metal or nitride materials (for first conductive layer 404) and oxide materials (for second dielectric 306) but not carbon-based hardmask material (for sacrificial fill material 502). As will be appreciated, each of the oxide, nitride, and carbide materials has a different etch rate for a given etch scheme (or set of etch schemes).

Figure 8:
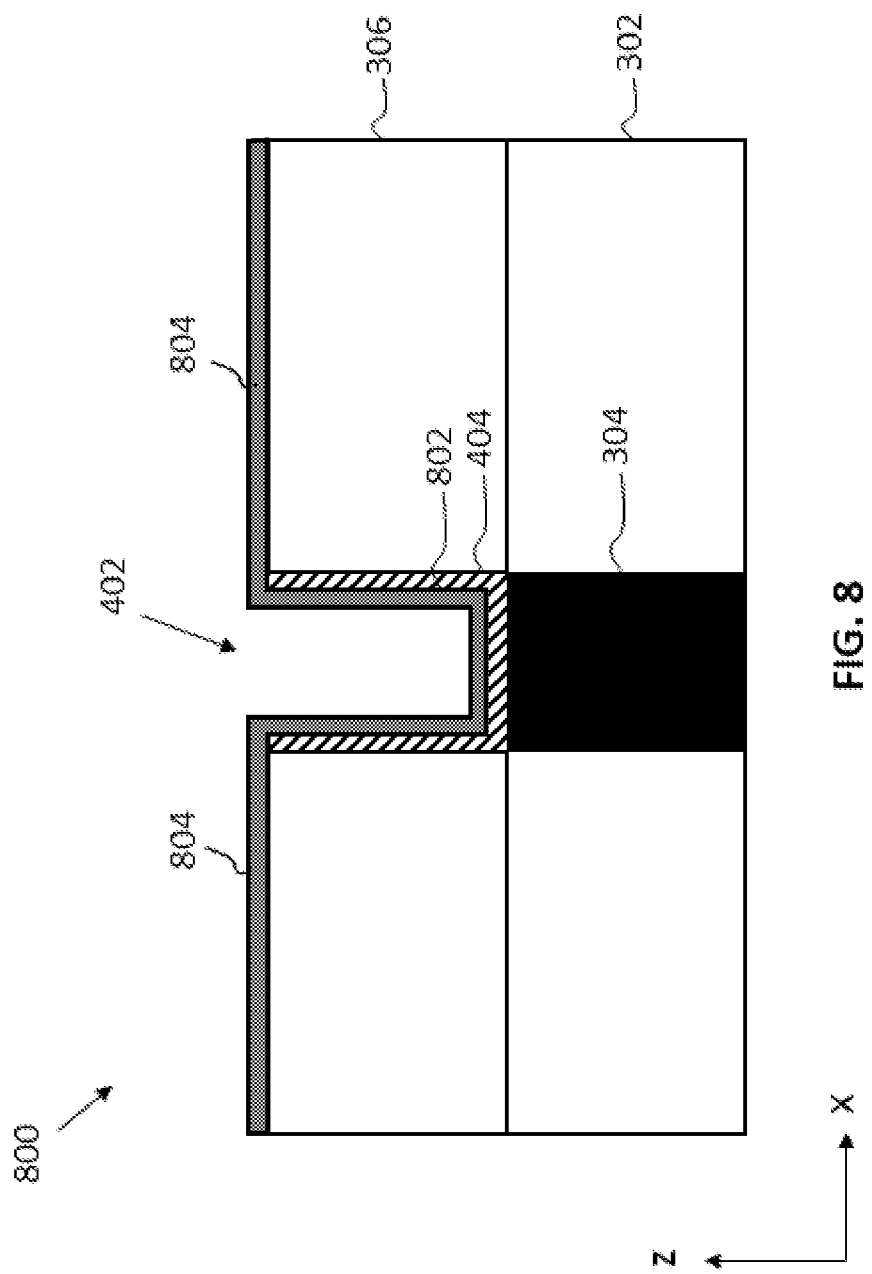

FIG. 8 illustrates another structure 800 in the fabrication process of a trench capacitor, according to an embodiment. Structure 800 includes a capacitor dielectric layer 802 that is deposited into opening 402 such that it is deposited on first conductive layer 404. Capacitor dielectric layer 802 also extends out of opening 402 and deposits on a top surface of second dielectric layer 306. Because portions of first conductive layer 404 were previously removed, capacitor dielectric layer 802 includes planar portions 804 that are directly on the top surface of second dielectric layer 306 while also protecting a top portion of first conductive layer 404 in opening 402.

Capacitor dielectric layer 802 may be deposited using substantially conformal deposition techniques (e.g, ALD and plasma-enhanced CVD) to ensure that first conductive layer 404 is sufficiently covered by capacitor dielectric layer 802 within opening 402. Just as with the thickness of the electrodes, the thickness of the capacitor dielectric layer 802 may vary from one embodiment to the next. In some embodiments, the capacitor dielectric layer 802 is deposited to a blanket thickness of between about 1 nm and about 20 nm (e.g., 4 to 20 nm). Capacitor dielectric layer 802 may be any one of a variety of different dielectric materials including dielectrics such as, for example, silicon oxide ($SiO_2$), silicon nitride ($Si_3N_4$), silicon oxynitride ($Si_2ON_2$), carbon-doped nitride, carbon-doped oxide, aluminum oxide ($Al_2O_3$), hafnium oxide ($HfO_2$), tantalum oxide ($Ta_2O_5$), or lanthanum oxide ($La_2O_3$). Other possible high-k materials for capacitor dielectric layer 802 include hafnium silicon oxide, lanthanum aluminum oxide, zirconium oxide, zirconium silicon oxide, titanium oxide, barium strontium titanium oxide, barium titanium oxide, strontium titanium oxide, yttrium oxide, lead scandium tantalum oxide, and lead zinc niobate. In some embodiments, an annealing process may be carried out on the high-k dielectric to improve its quality. In still further embodiments, materials for capacitor dielectric layer 802 include ferroelectric or antiferroelectric materials (depending on level of dopant) such as hafnium oxide doped with silicon, lanthanum, nitrogen, aluminum, zirconium, germanium, or yttrium. Additional example ferroelectric materials that could be used for capacitor dielectric layer 802 include perovskite ferroelectrics such as ammonium dihydrogen phosphate ($NH_4H_2PO_4$), potassium dihydrogen phosphate ($KH_2PO_4$), lithium niobate ($LiNbO_3$), lithium tantalate ($LiTaO_3$), barium titanate ($BaTiO_3$), lead titanate ($PbTiO_3$), lead zirconate titanate ($Pb(Zr,Ti)O_3$), lead lanthanide titanate (($Pb$, $La$)$TiO_3$), and lead lanthanide zirconate titanate (($Pb$,$La$)($Zr$, $Ti$)$O_3$). Note the stoichiometry of such dielectric materials may vary from one embodiment to the next, and such compounds represented without stoichiometric coefficients or values are intended to represent all forms of that high-k dielectric material. Moreover, if specific example stoichiometric coefficients or values are provided in an example compound, that example is not intended to limit that particular material to that particular stoichiometry; rather, all forms of that high-k dielectric material are intended to be represented based on that specific example.

Figure 9:
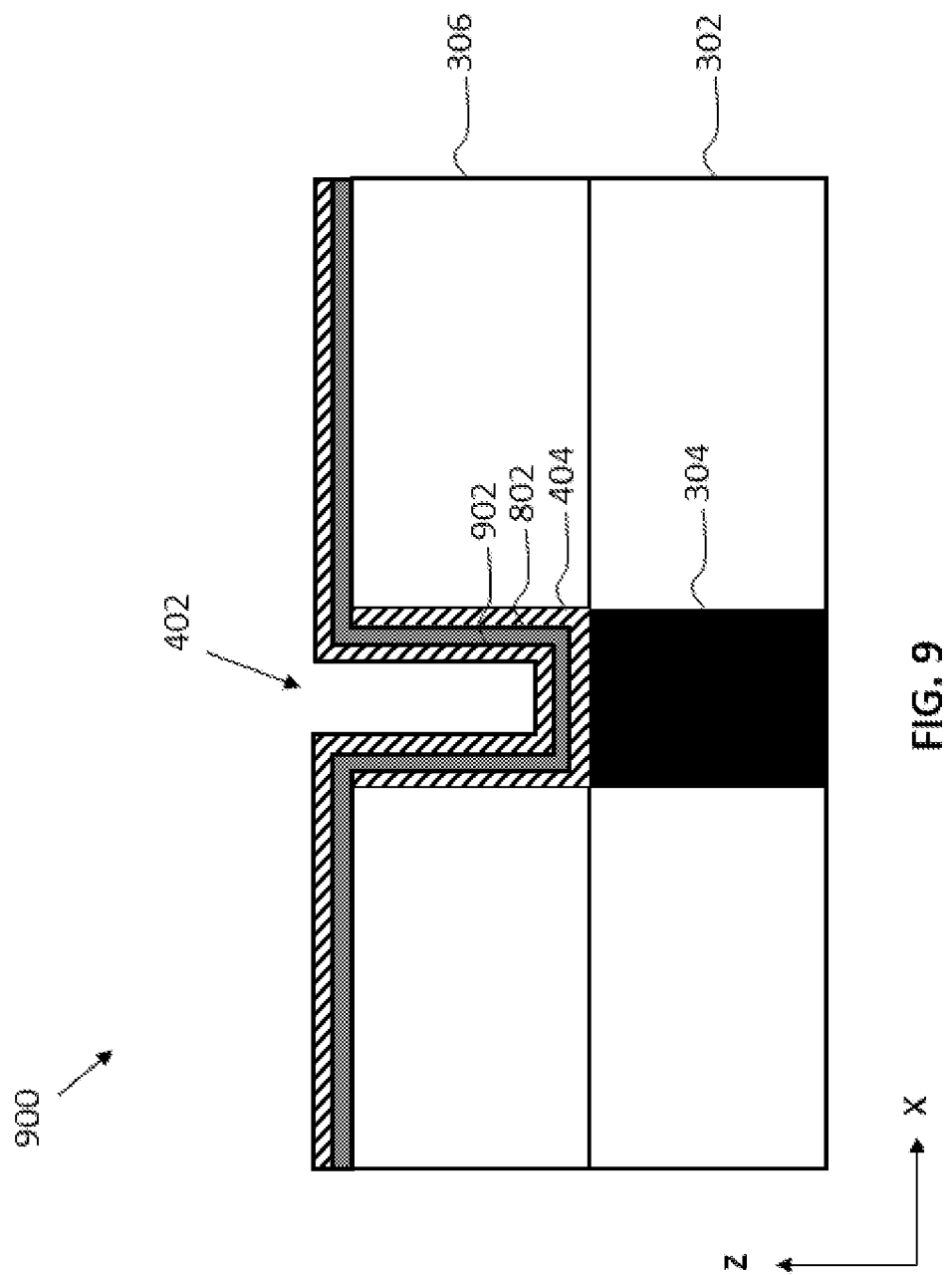

FIG. 9 illustrates another structure 900 in the fabrication process of a trench capacitor, according to an embodiment. A second conductive layer 902 is deposited within opening 402 and on capacitor dielectric layer 802. Note that the first conductive layer 404 and the second conductive layer 902 may also be referred to herein as the bottom and top electrodes, respectively; or the bottom and top plates, respectively. In some embodiments, second conductive layer 902 is deposited using a substantially conformal deposition technique to ensure a continuous coverage over capacitor dielectric layer 802 within opening 402. Such example techniques include ALD and plasma-enhanced CVD. Second conductive layer 902 may be deposited to a blanket thickness of between about 2 nm and 20 nm, although other thicknesses may be used as previously explained. Second conductive layer 902 may be copper, although any number of other suitable conductor materials can be used. In some other specific example embodiments, second conductive layer 902 may include any conductive material, such as TiN, TiSiN, TaN, TiAlCN, pSi, Al, Au, W, Co, Pt, Ru, or Ir. Second conductive layer 902 may be the same material as first conductive layer 404.

Figure 10:
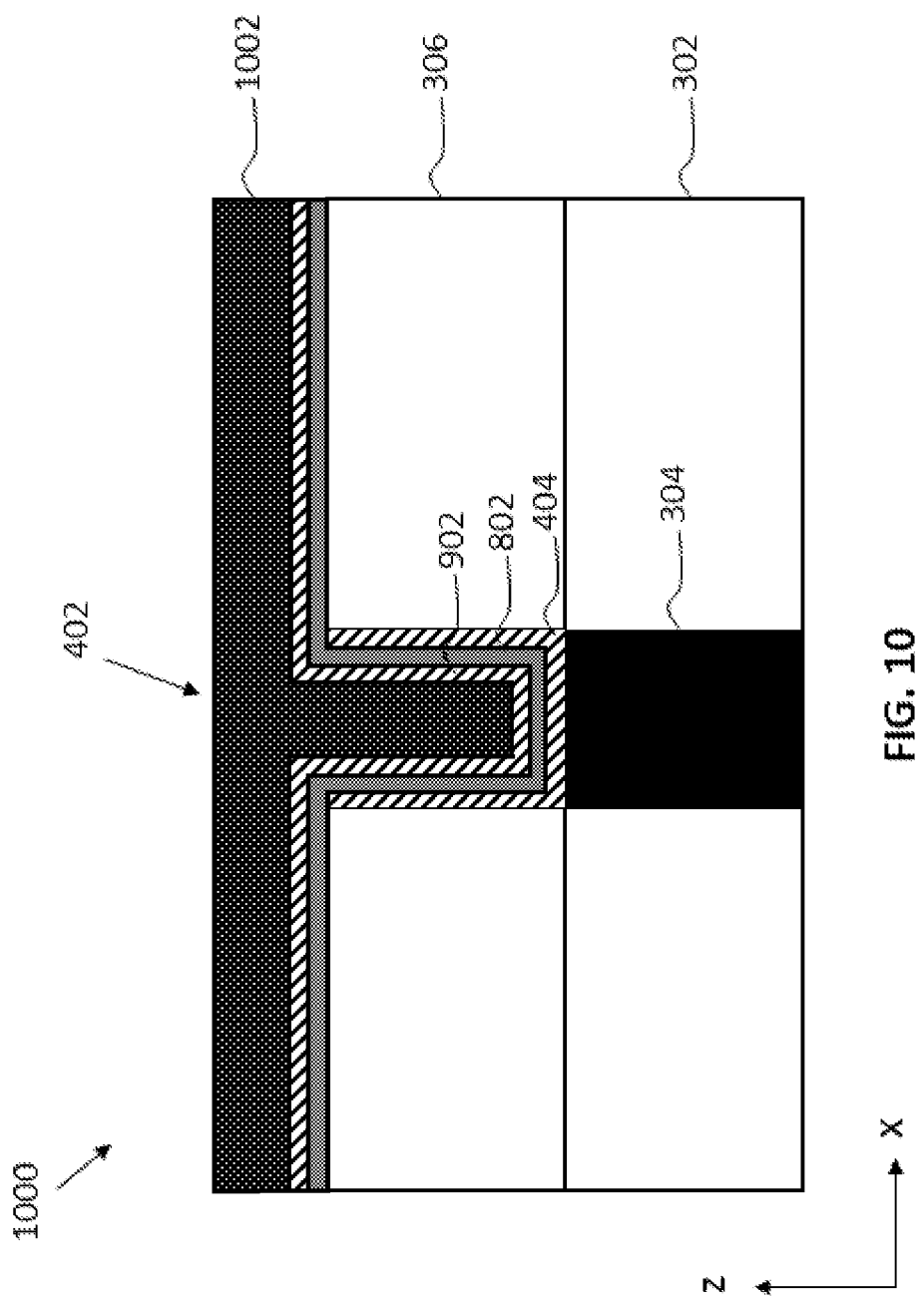

FIG. 10 illustrates another structure 1000 in the fabrication process of a trench capacitor, according to an embodiment. A conductive fill material 1002 is formed on second conductive layer 902. In some embodiments, conductive fill material 1002 fills (although some voids may exist) a remainder of the space within opening 402 and also extends some thickness in the z-direction over the top surface of second dielectric layer 306. Conductive fill material 1002 may include any of the conductive materials described above for first conductive layer 404 and second conductive layer 902. In some embodiments, conductive fill material 1002 is the same material as second conductive layer 902 (both are copper or titanium nitride), while in other embodiments the conductive fill material 1002 is different from the second conductive layer 902 (e.g., 902 is copper and 1002 is aluminum).

In some embodiments, conductive fill material 1002 is electrodeposited using second conductive layer 902 as a seed layer. In some other embodiments, conductive fill material 1002 is deposited using any known deposition technique, such as CVD.

Figure 11:
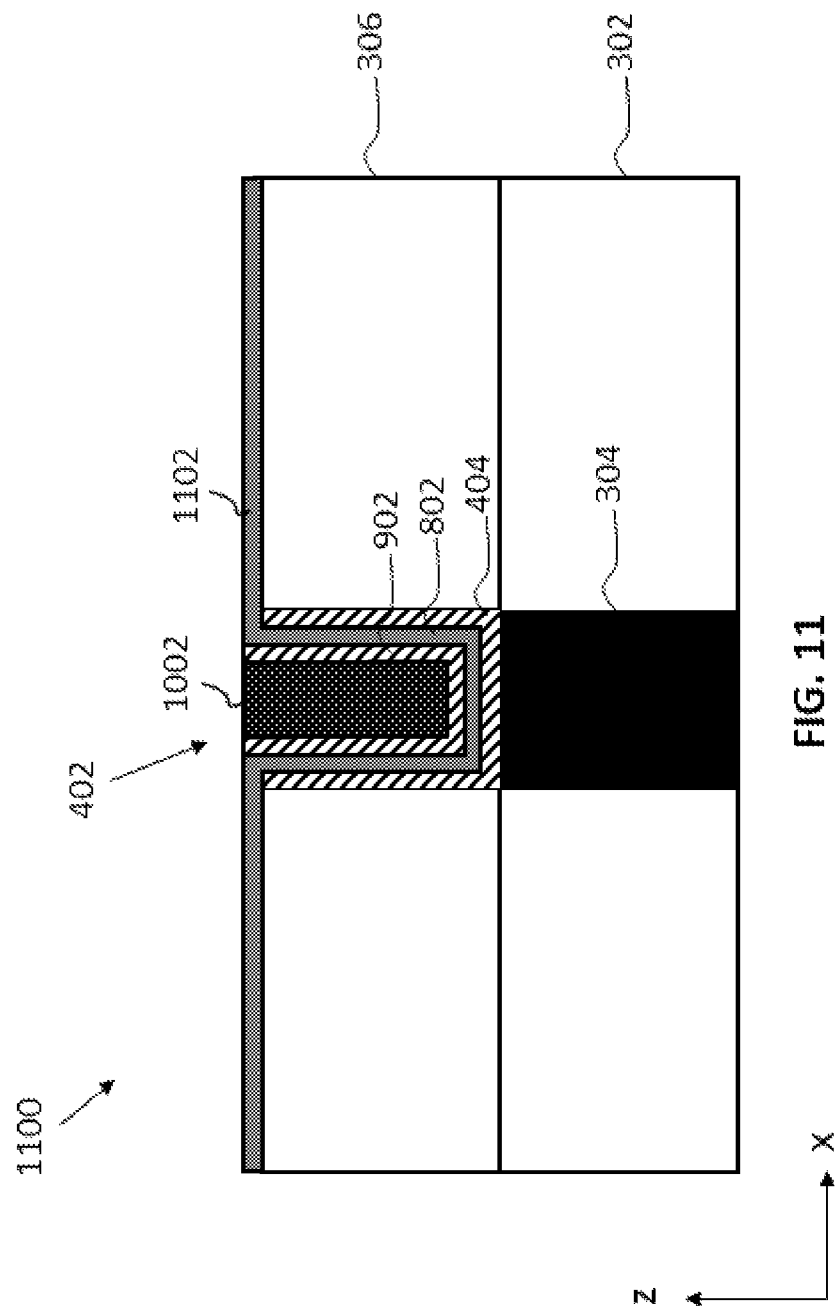

FIG. 11 illustrates another structure 1100 in the fabrication process of a trench capacitor, according to an embodiment. In structure 1100, portions of second conductive layer 902 and conductive fill material 1002 that are above a top planar surface 1102 of capacitor dielectric layer 802 have been removed. Thus, according to some embodiments, capacitor dielectric layer 802 is the only capacitor layer that exists both within opening 402 and over the top surface of second dielectric layer 306. Note, however, that the uppermost portions of the second conductive layer 902 and fill material 1002 also extend above the top surface of the second dielectric layer 306, they just don't extend laterally so as to be over the top surface of second dielectric layer 306, in this example case. According to an embodiment, a CMP technique is used to remove the portions of second conductive layer 902 and conductive fill material 1002 above top planar surface 1102 of capacitor dielectric layer 802, thus forming a planarized surface. Because capacitor dielectric layer 802 extends up and over the sides of opening 402, the only exposed conductive material on the top surface of structure 1100 belongs to second conductive layer 902 and conductive fill material 1002, which collectively form one terminal of the capacitor. The capacitor's other terminal, provided by first conductive layer 404, is shielded by capacitor dielectric layer 802.

Figure 12:
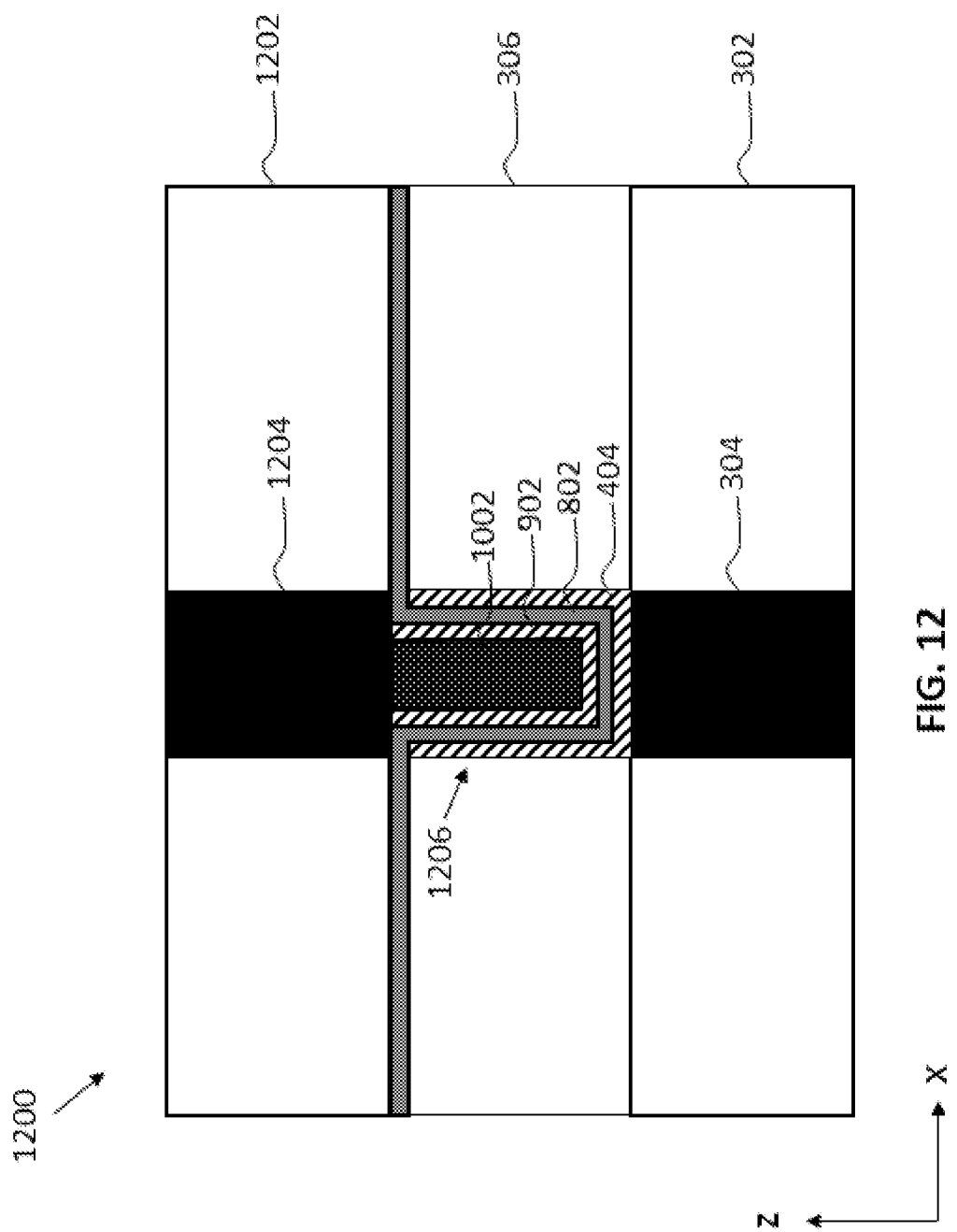

FIG. 12 illustrates another structure 1200 in the fabrication process of a trench capacitor, according to an embodiment. Structure 1200 includes a third dielectric layer 1202 deposited over second dielectric layer 306 and having a second conductive contact 1204 disposed through a thickness of third dielectric layer 1202. Each of the capacitor layers within opening 402 make up the completed trench capacitor 1206. As previously explained, there may be a passivation layer and/or an etch stop layer provisioned between the second and third dielectric layers 306 and 1202, in some embodiments. Third dielectric layer 1202 may be any suitable ILD material. Examples of ILD materials include silicon oxide, silicon nitride, and low-k dielectrics (e.g., porous silicon dioxide). Third dielectric layer 1202 may be deposited using any number of well-known deposition techniques, such as PVD or CVD techniques. In some embodiments, third dielectric layer 1202 is the same material as both first dielectric layer 302 and second dielectric layer 306. Second conductive contact 1204 may be generally any conductive material, as will be appreciated. Some examples of conductive materials to use for second conductive contact 1204 include TiN, TiSiN, TaN, TiAlCN, pSi, Cu, Al, Au, W, Co, Pt, Ru, RuO, IrO and Ir. Second conductive contact 1204 may be formed using well-known techniques (e.g., single and dual damascene, lithography). In some embodiments, second conductive contact 1204 includes the same material as first conductive contact 304.

When etching the opening through third dielectric layer 1202, the opening may expose a portion of capacitor dielectric layer 802, whether that portion be immediately adjacent to the second conductive layer 902 and that extends over first conductive layer 404, or even over the top surface of second dielectric layer 306. As a result, second conductive contact 1204 may have a width in the x-direction along a top surface of trench capacitor 1206 that has substantially the same width as trench capacitor 1206 or that has a width in the x-direction along a top surface of trench capacitor 1206 that is wider than trench capacitor 1206. Alternatively, such lateral width of the second conductive contact 1204 may be substantially the same width as trench capacitor 1206, but be offset to one side of the trench capacitor. In either of these scenarios, there is an unlanded portion of second conductive contact 1204. These wide widths and/or unlanded portions of second conductive contact 1204 are made possible due to the lateral extension of capacitor dielectric layer 802 protecting first conductive layer 404 from shorting with second conductive contact 1204, according to an embodiment.

Figure 13:
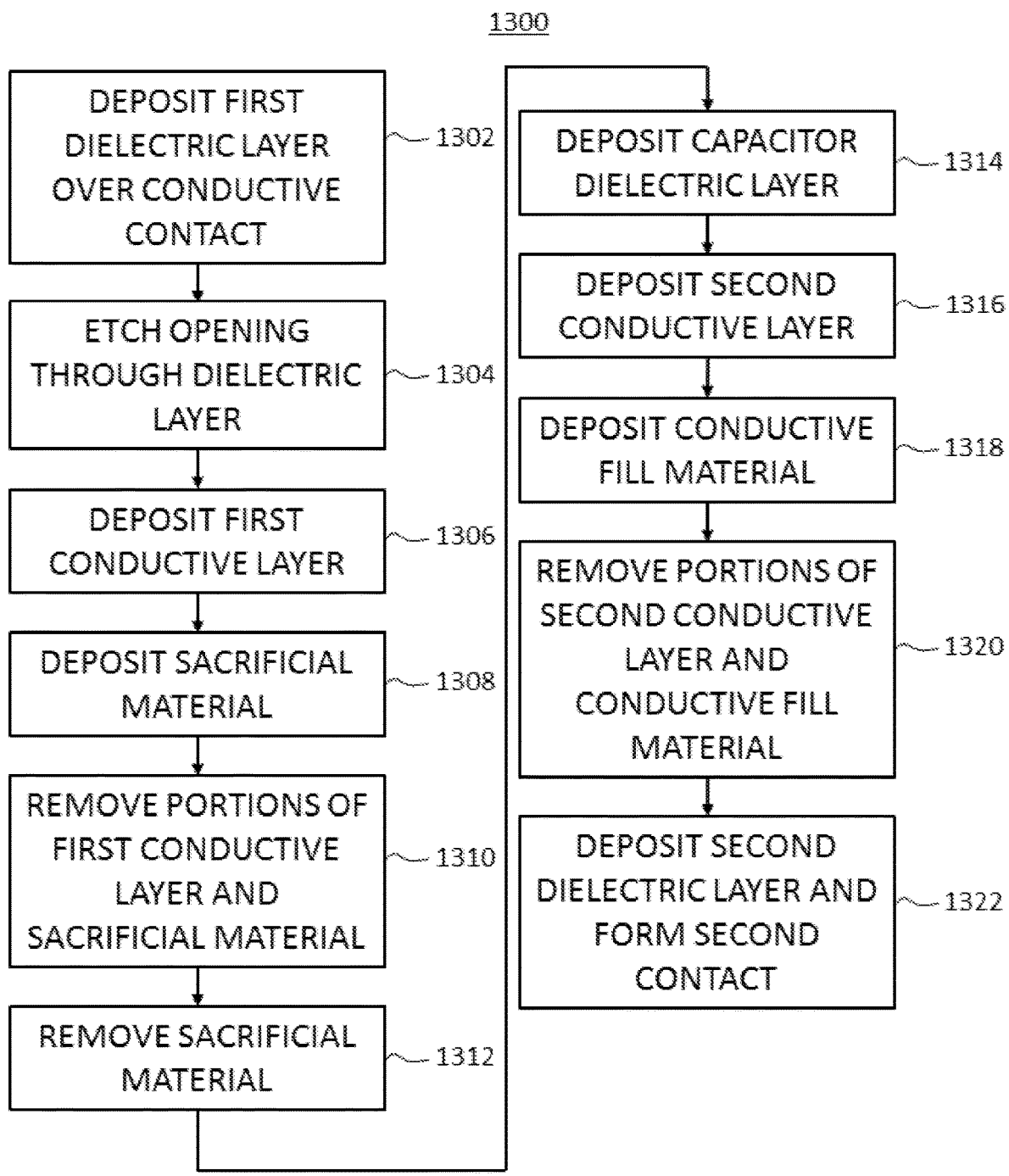
FIG. 13 is a flowchart of a fabrication process for a trench capacitor, in accordance with an embodiment of the present disclosure.

FIG. 13 is a flow chart of a method 1300 for fabricating a trench capacitor, according to an embodiment. Various operations of method 1300 may be illustrated in FIGS. 3-12. However, the correlation of the various operations of method 1300 to the specific components illustrated in FIGS. 3-12 is not intended to imply any structural and/or use limitations. Rather, FIGS. 3-12 provide one example embodiment of method 1300. Other operations may be performed before, during, or after any of the operations of method 1300.

Method 1300 begins at operation 1302 where a first dielectric layer is deposited on a lower dielectric layer, or on (or over) a substrate, that includes a first conductive contact. In the former case, the first conductive contact could be, for example, a conductive via or line; in the latter case, the first conductive contact could be, for example, a source or drain contact, or a gate electrode. The first dielectric layer may be any suitable ILD material and may be deposited using well-known PVD or CVD techniques, for instance. The first dielectric layer may be deposited both directly on the first conductive contact in the lower dielectric layer/substrate and on the lower dielectric layer/substrate. In some cases, there may be one or more intervening layers (e.g., passivation, local interconnect, etch stop) between the lower dielectric layer/substrate and first dielectric layer.

Method 1300 continues with operation 1304 where an opening is etched through the first dielectric layer. The opening may be etched through a thickness of the dielectric layer and aligned over at least a portion of the first conductive contact such that the portion of the first conductive contact is exposed at the bottom of the opening. The opening may be etched using standard lithography and wet/dry etching techniques, such as RIE, to remove an unmasked portion of the material of the first dielectric layer. In some embodiments, the opening has a width between about 50 nm and about 300 nm. In a more general sense, the geometry of the opening can be set based on the particulars of a given design layout.

Method 1300 continues with operation 1306 where a first conductive layer is deposited. The first conductive layer is deposited within the opening and on a top surface of the first dielectric layer. The first conductive layer may be deposited using a substantially conformal deposition technique to ensure that the inner sidewalls of the opening are covered by the first conductive layer. The first conductive layer may be deposited to a blanket thickness of between about 6 nm and 20 nm, although other embodiments may have a different range of thicknesses, as will be appreciated. The first conductive layer may be copper. In some embodiments, the first conductive layer may include any conductive material, such as TiN, TiSiN, TaN, TiAlCN, pSi, Al, Au, W, Co, Pt, Ru, or Ir.

Method 1300 continues with operation 1308 where a sacrificial fill material is deposited. The sacrificial fill material may fill a remaining portion of the opening, although a total fill is not required (e.g., voids may exist in the fill.) The sacrificial fill material may be, for example, a carbon hardmask or a polymer material or any dielectric material that is different than the material of the first dielectric layer and the first conductive layer, for purposes of etch selectivity, as previously explained. In some example embodiments, the sacrificial fill material is deposited using a spin-on technique and may include any carbon-based hard mask materials or any spin-on-glass (SOG) materials.

Method 1300 continues with operation 1310 where portions of the sacrificial fill material and the first conductive layer are removed. The removed portions exist above a top surface of the first dielectric layer, such that only portions of the sacrificial fill material and the first conductive layer within the opening remain. An etching process using wet chemical etchants can be used to remove the exposed materials above the opening. However, this etching process is difficult to control precisely and can result in accidental over-etching of the first conductive layer within the opening. According to an embodiment, a CMP technique is used to remove portions of the sacrificial fill material and the first conductive layer above the top surface of the first dielectric layer, thus forming a planarized surface.

Method 1300 continues with operation 1312 where the sacrificial material is selectively removed from within the opening, leaving behind only the first conductive layer along the sidewalls and bottom of the opening. In one embodiment, the sacrificial fill material is removed using standard wet etching processes that are selective to the first dielectric layer and the first conductive layer (i.e., the etch scheme removes the sacrificial material at a much higher rate than the first dielectric layer and the first conductive layer). Alternatively, a mask may be patterned to protect the first dielectric layer and the first conductive layer while the sacrificial material is etched.

Method 1300 continues with operation 1314 where a capacitor dielectric layer is deposited. The capacitor dielectric layer is deposited on the first conductive layer within the opening and on the first dielectric layer outside of the opening. The capacitor dielectric layer may be deposited using substantially conformal deposition techniques to ensure that the first conductive layer is sufficiently covered by the capacitor dielectric layer within the opening. The capacitor dielectric layer may be deposited to a blanket thickness of between about 4 nm and about 15 nm, although other thicknesses can be used as well, as will be appreciated. The capacitor dielectric layer may be any one of a variety of different dielectric materials including dielectrics such as those examples previously provided with reference to capacitor dielectric layer 802.

Method 1300 continues with operation 1316 where a second conductive layer is deposited. The second conductive layer is deposited on the capacitor dielectric layer both in the opening and outside the opening over the top surface of the first dielectric layer. The second conductive layer may be deposited to a blanket thickness of between about 2 nm and 20 nm, although other thicknesses can be used as well, as will be appreciated. The second conductive layer may be copper, for instance. In some embodiments, the second conductive layer may include any conductive material, such as those previously indicated with respect to conductive layers 404 and 902. The second conductive layer may be the same material as the first conductive layer.

Method 1300 continues with operation 1318 where a conductive fill material is formed within the opening to fill a remaining portion of the opening. The conductive fill material is also formed over a top surface of the first dielectric layer outside of the opening. The conductive fill material may include any of the conductive materials described above for the first conductive layer and the second conductive layer. In some embodiments, the conductive fill material is the same material as the second conductive layer. The conductive fill material may be electrodeposited using the second conductive layer a seed layer, although any number of deposition techniques can be used.

Method 1300 continues with operation 1320 where portions of the conductive fill material and the second conductive layer are removed. According to an embodiment, portions of the conductive fill material and the second conductive layer over the top surface of the capacitor dielectric layer are removed, so as to expose a top surface of the capacitor dielectric layer. According to an embodiment, a CMP technique is used to remove the portions of the second conductive layer and the conductive fill material, thus forming a planarized surface on a top of the capacitor dielectric layer 802. As a result, the only exposed conductive material along the top surface of the structure at this stage belongs to the second conductive layer and the conductive fill material, according to an embodiment.

Method 1300 continues with operation 1322 where a second dielectric layer is deposited over the first dielectric layer. Recall there may also be one or more intervening layers (e.g., passivation, etch stop) prior to the second dielectric layer. As previously explained, the second dielectric layer may be any suitable ILD material and may be deposited using suitable deposition techniques. In some embodiments, the second dielectric layer is the same material as the first dielectric layer. A second conductive contact or interconnect feature is formed in the second dielectric layer such that the second conductive contact or interconnect feature (e.g., via or line) makes ohmic contact with the conductive fill material and/or the second conductive layer. Because of the presence of the capacitor dielectric layer covering the top surface of the first conductive layer, the second conductive contact can be as wide as, or even wider than, the opening that contains the layers of the trench capacitor. Further note that alignment precision can be somewhat relaxed, as any non-landing portion of the second conductive contact will be on the laterally extending portion of the capacitor dielectric. A non-landing portion is effectively any portion of the second conductive contact that is not on the conductive fill material and/or the second conductive layer.

Example Electronic Device

Figure 14:
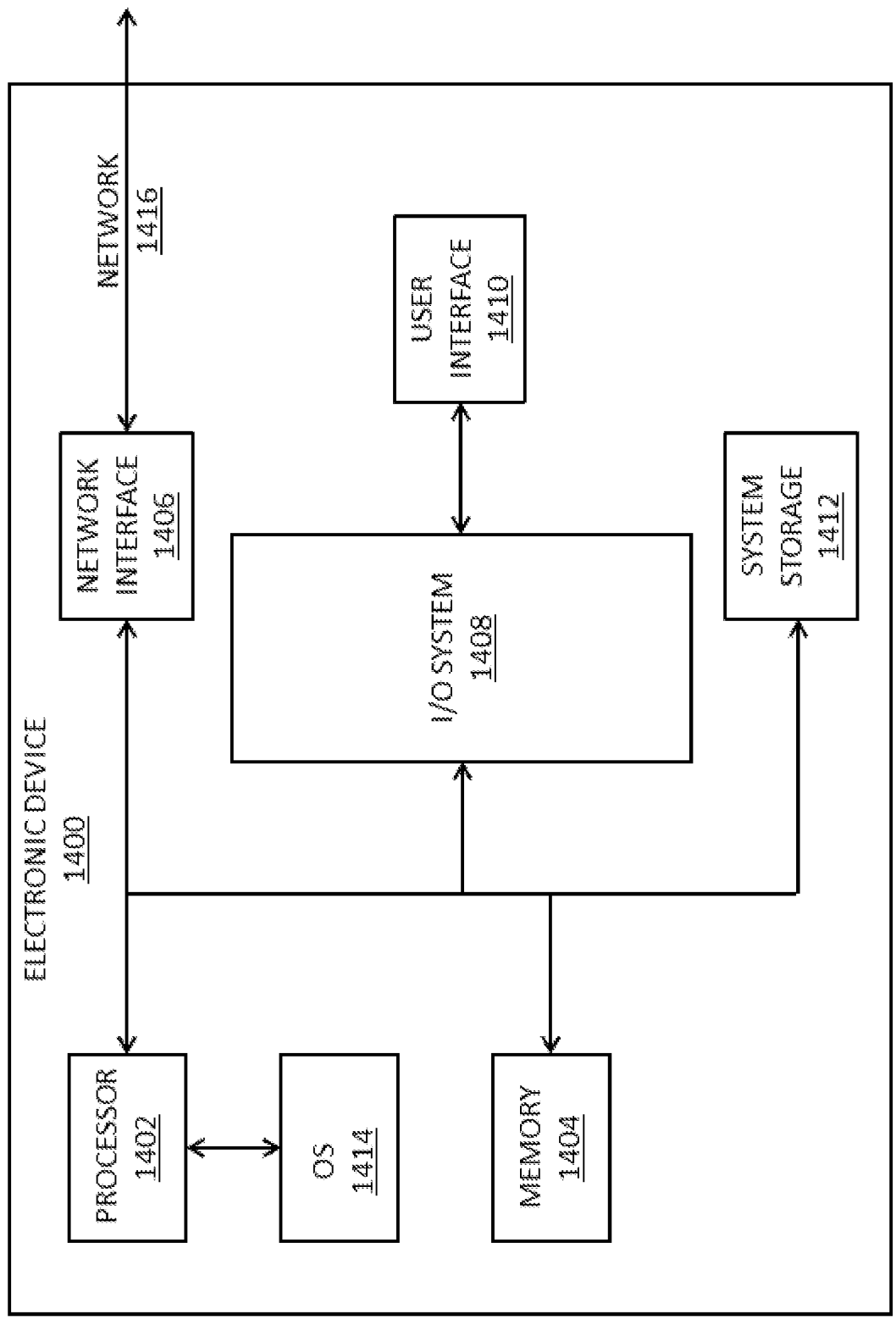
FIG. 14 illustrates an example electronic device that can include one or more of the embodiments of the present disclosure.

FIG. 14 illustrates an example electronic device 1400 that may include one or more integrated trench capacitors such as the embodiments disclosed herein. In some embodiments, electronic device 1400 may host, or otherwise be incorporated into a personal computer, workstation, server system, laptop computer, ultra-laptop computer, tablet, touchpad, portable computer, handheld computer, palmtop computer, personal digital assistant (PDA), cellular telephone, combination cellular telephone and PDA, smart device (for example, smartphone or smart tablet), mobile internet device (MID), messaging device, data communication device, imaging device, wearable device, embedded system, and so forth. Any combination of different devices may be used in certain embodiments.

In some embodiments, electronic device 1400 may comprise any combination of a processor 1402, a memory 1404, a network interface 1406, an input/output (I/O) system 1408, a user interface 1410, and a storage system 1412. As can be further seen, a bus and/or interconnect is also provided to allow for communication between the various components listed above and/or other components not shown. Electronic device 1400 can be coupled to a network 1416 through network interface 1406 to allow for communications with other computing devices, platforms, or resources. Other componentry and functionality not reflected in the block diagram of FIG. 14 will be apparent in light of this disclosure, and it will be appreciated that other embodiments are not limited to any particular hardware configuration.

Processor 1402 can be any suitable processor and may include one or more coprocessors or controllers to assist in control and processing operations associated with electronic device 1400. In some embodiments, processor 1402 may be implemented as any number of processor cores. The processor (or processor cores) may be any type of processor, such as, for example, a micro-processor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core.

Memory 1404 can be implemented using any suitable type of digital storage including, for example, flash memory and/or random access memory (RAM). In some embodiments, memory 1404 may include various layers of memory hierarchy and/or memory caches. Memory 1404 may be implemented as a volatile memory device such as, but not limited to, a RAM, dynamic RAM (DRAM), or static RAM (SRAM) device. Storage system 1412 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage system 1412 may comprise technology to increase the storage performance enhanced protection for valuable digital media when multiple hard drives are included.

Processor 1402 may be configured to execute an Operating System (OS) 1414 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS).

Network interface 1406 can be any appropriate network chip or chipset which allows for wired and/or wireless connection between other components of electronic device 1400 and/or network 1416, thereby enabling electronic device 1400 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 1408 may be configured to interface between various I/O devices and other components of electronic device 1400. I/O devices may include, but not be limited to, a user interface 1410. User interface 1410 may include devices (not shown) such as a display element, touchpad, keyboard, mouse, and speaker, etc. I/O system 1408 may include a graphics subsystem configured to perform processing of images for rendering on a display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 1402 or any chipset of electronic device 1400.

It will be appreciated that in some embodiments, the various components of the electronic device 1400 may be combined or integrated in a system-on-a-chip (SoC) architecture. In some embodiments, the components may be hardware components, firmware components, software components or any suitable combination of hardware, firmware or software. In some embodiments, any one of the described components of electronic device 1400 may include one or more trench capacitors, such as any of the trench capacitor embodiments disclosed herein, as part of a printed circuit board or integrated circuit chip.

In various embodiments, electronic device 1400 may be implemented as a wireless system, a wired system, or a combination of both. When implemented as a wireless system, electronic device 1400 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, electronic device 1400 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

Numerous specific details have been set forth herein to provide a thorough understanding of the embodiments. It will be understood in light of this disclosure, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

Example 1 is an integrated circuit structure including an interlayer dielectric (ILD) structure having a dielectric material, and a capacitor within the ILD structure, such that the capacitor is laterally between first and second portions of the ILD structure. The capacitor includes a first conductive layer on sidewalls of the ILD structure, a capacitor dielectric layer on the first conductive layer, a second conductive layer on the capacitor dielectric layer, and a conductive fill material on the second conductive layer. The first conductive layer is laterally between the first and second portions of the ILD structure. The capacitor dielectric layer is laterally between first and second portions of the first conductive layer, and also laterally extends along a top surface of the ILD structure. The second conductive layer is laterally between first and second portions of the capacitor dielectric layer. The conductive fill material is laterally between first and second portions of the second conductive layer.

Example 2 includes the subject matter of Example 1, wherein the ILD structure is an upper ILD structure that is on a lower ILD structure, the lower ILD structure having a conductive feature extending through at least a portion of a thickness of the lower ILD structure, and wherein the first conductive layer contacts the conductive feature.

Example 3 includes the subject matter of Example 2, wherein the conductive feature comprises one of a source contact, a drain contact, a gate contact, a gate electrode, a via, a line, or a contact pad.

Example 4 includes the subject matter of Example 2 or 3, wherein the conductive feature is a metal.

Example 5 includes the subject matter of any one of Examples 1-4, wherein the ILD structure is a first ILD structure and the integrated circuit structure further comprises a second ILD structure over the first ILD structure, the second ILD structure comprising a dielectric material and a conductive interconnect feature, wherein the conductive interconnect feature contacts at least a portion of the conductive fill material and/or at least a portion of the second conductive layer.

Example 6 includes the subject matter of Example 5, wherein the conductive interconnect feature comprises one of a via or a line.

Example 7 includes the subject matter of Example 5 or 6, wherein the conductive interconnect feature is a metal.

Example 8 includes the subject matter of any one of Examples 5-7, wherein the conductive interconnect feature has a laterally extending width that is greater than a laterally extending width of the conductive fill material.

Example 9 includes the subject matter of any one of Examples 5-8, wherein the conductive interconnect feature contacts a portion of the capacitor dielectric layer on the top surface of the first ILD structure.

Example 10 includes the subject matter of any one of Examples 1-9, wherein the capacitor dielectric layer comprises a high-k dielectric material.

Example 11 includes the subject matter of any one of Examples 1-10, wherein the capacitor dielectric layer comprises a ferroelectric material.

Example 12 includes the subject matter of Example 11, wherein the ferroelectric material comprises hafnium and at least one of silicon, lanthanum, nitrogen, aluminum, zirconium, germanium, or yttrium.

Example 13 includes the subject matter of any one of Examples 1-12, wherein the second conductive layer extends above the top surface of the ILD structure.

Example 14 is an electronic device that includes a chip package. The chip package includes one or more semiconductor dies, wherein the one or more semiconductor dies includes at least one capacitor structure. The capacitor structure includes a first conductive layer on the sidewalls of an opening through a thickness of a dielectric layer, a capacitor dielectric layer on the first conductive layer, a second conductive layer on the capacitor dielectric layer, and a conductive fill material on the second conductive layer. The capacitor dielectric layer extends above the opening and is on a top surface of the dielectric layer. The conductive fill material fills a remaining portion of the opening.

Example 15 includes the subject matter of Example 14, wherein the dielectric layer is on a lower level dielectric layer, the lower level dielectric layer having a metal contact extending through at least a portion of a thickness of the lower level dielectric layer, and wherein the first conductive layer contacts the metal contact.

Example 16 includes the subject matter of Example 14 or 15, wherein the dielectric layer is a first dielectric layer, the opening is a first opening, and the conductive fill material is a first conductive fill material, the capacitor structure further comprising: a second dielectric layer over the first dielectric layer; and a second conductive fill material that fills an opening through a thickness of the second dielectric layer, wherein the second conductive fill material contacts at least a portion of the first conductive fill material.

Example 17 includes the subject matter of Example 16, wherein the second conductive fill material has a width that is greater than a width of the first conductive fill material.

Example 18 includes the subject matter of Example 16 or 17, wherein the second conductive fill material contacts a portion of the capacitor dielectric layer on the top surface of the first dielectric layer.

Example 19 includes the subject matter of any one of Examples 14-18, wherein the capacitor dielectric layer comprises a high-k dielectric material.

Example 20 includes the subject matter of any one of Examples 14-19, wherein the capacitor dielectric layer comprises a ferroelectric material.

Example 21 includes the subject matter of Example 20, wherein the ferroelectric material comprises hafnium and at least one of silicon, lanthanum, nitrogen, aluminum, zirconium, germanium, or yttrium.

Example 22 includes the subject matter of any one of Examples 14-21, wherein the second conductive layer extends above the opening.

Example 23 is a method of fabricating a capacitor. The method includes depositing a dielectric layer over a substrate; etching an opening through a thickness of the dielectric layer; depositing a first conductive layer in the opening and on a top surface of the dielectric layer; depositing a sacrificial material into the opening such that the sacrificial material fills a remainder of the opening; removing a portion of the first conductive layer and a portion of the sacrificial material that is above a top surface of the dielectric layer; removing the sacrificial material from within the opening; depositing a capacitor dielectric layer in the opening and on a top surface of the dielectric layer; depositing a second conductive layer in the opening and over a top surface of the dielectric layer; depositing a conductive fill material into the opening such that the conductive fill material fills a remainder of the opening; and removing a portion of the second conductive layer and a portion of the conductive fill material that is above the top surface of the dielectric layer.

Example 24 includes the subject matter of Example 23, wherein the dielectric layer is a first dielectric layer, the opening is a first opening, and the conductive fill material is a first conductive fill material, the method further comprising: depositing a second dielectric layer over the first dielectric layer; etching a second opening through the second dielectric layer such that at least a portion of the first conductive fill material is exposed in the second opening; and depositing a second conductive fill material in the second opening.

Example 25 includes the subject matter of Example 24, wherein etching the second opening comprises etching the second opening having a width that is greater than a width of the first conductive fill material within the opening.

Example 26 includes the subject matter of Example 24 or 25, wherein etching the second opening comprises exposing a portion of the capacitor dielectric layer on the top surface of the first dielectric layer.

Example 27 includes the subject matter of any one of Examples 23-26, wherein removing the portion of the first conductive layer and the portion of the sacrificial material comprises using chemical mechanical polishing (CMP) to remove the portion of the first conductive layer and the portion of the sacrificial material.

Example 28 includes the subject matter of any one of Examples 23-27, wherein each of the first conductive layer, capacitor dielectric layer, and second conductive layer is deposited using atomic layer deposition (ALD).

Example 29 includes the subject matter of any one of Examples 23-28, wherein removing the portion of the second conductive layer and the portion of the conductive fill material comprises using CMP to remove the portion of the second conductive layer and the portion of the conductive fill material.

Example 30 includes the subject matter of any one of Examples 23-29, wherein depositing the conductive fill material into the opening comprises electroplating the conductive fill material within the opening.

What is claimed is:
1. An integrated circuit structure, comprising:
    an interlayer dielectric (ILD) structure comprising dielectric material;
    a capacitor within the ILD structure, such that the capacitor is laterally between first and second portions of the

ILD structure, the capacitor including first conductive layer on sidewalls of the ILD structure, such that the first conductive layer is laterally between the first and second portions of the ILD structure;
a capacitor dielectric layer on the first conductive layer, such that the capacitor dielectric layer is laterally between first and second portions of the first conductive layer, and wherein the capacitor dielectric layer also laterally extends along a top surface of the ILD structure, the capacitor dielectric layer having an uppermost surface;
a second conductive layer on the capacitor dielectric layer, such that the second conductive layer is laterally between first and second portions of the capacitor dielectric layer, the second conductive layer having an uppermost surface at a same level as the uppermost surface of the capacitor dielectric layer; and
a conductive fill material on the second conductive layer, wherein the conductive fill material is laterally between first and second portions of the second conductive layer.

2. The integrated circuit structure of claim 1, wherein the ILD structure is an upper ILD structure that is on a lower ILD structure, the lower ILD structure having a conductive feature extending through at least a portion of a thickness of the lower ILD structure, and wherein the first conductive layer contacts the conductive feature.

3. The integrated circuit structure of claim 2, wherein the conductive feature comprises one of a source contact, a drain contact, a gate contact, a gate electrode, a via, a line, or a contact pad.

4. The integrated circuit structure of claim 2, wherein the conductive feature is a metal.

5. The integrated circuit structure of claim 1, wherein the ILD structure is a first ILD structure, the integrated circuit structure further comprising:
a second ILD structure over the first ILD structure, the second ILD structure comprising a dielectric material and a conductive interconnect feature, wherein the conductive interconnect feature contacts at least a portion of the conductive fill material and/or at least a portion of the second conductive layer.

6. The integrated circuit structure of claim 5, wherein the conductive interconnect feature comprises one of a via or a line.

7. The integrated circuit structure of claim 5, wherein the conductive interconnect feature is a metal.

8. The integrated circuit structure of claim 5, wherein the conductive interconnect feature has a laterally extending width that is greater than a laterally extending width of the conductive fill material.

9. The integrated circuit structure of claim 5, wherein the conductive interconnect feature contacts a portion of the capacitor dielectric layer on the top surface of the first ILD structure.

10. The integrated circuit structure of claim 1, wherein the capacitor dielectric layer comprises a ferroelectric material.

11. The integrated circuit structure of claim 10, wherein the ferroelectric material comprises hafnium and at least one of silicon, lanthanum, nitrogen, aluminum, zirconium, germanium, or yttrium.

12. The integrated circuit structure of claim 1, wherein the second conductive layer extends above the top surface of the ILD structure.

13. An electronic device, comprising:
a chip package comprising one or more semiconductor dies, wherein the one or more semiconductor dies includes at least one capacitor structure, the capacitor structure comprising:
a first conductive layer on sidewalls of an opening through a thickness of a dielectric layer;
a capacitor dielectric layer on the first conductive layer, wherein the capacitor dielectric layer extends above the opening and is on a top surface of the dielectric layer, the capacitor dielectric layer having an uppermost surface;
a second conductive layer on the capacitor dielectric layer, the second conductive layer having an uppermost surface at a same level as the uppermost surface of the capacitor dielectric layer; and
a conductive fill material on the second conductive layer, wherein the conductive fill material fills a remaining portion of the opening.

14. The electronic device of claim 13, wherein the dielectric layer is on a lower level dielectric layer, the lower level dielectric layer having a metal contact extending through at least a portion of a thickness of the lower level dielectric layer, and wherein the first conductive layer contacts the metal contact.

15. The electronic device of claim 13, wherein the dielectric layer is a first dielectric layer, the opening is a first opening, and the conductive fill material is a first conductive fill material, the capacitor structure further comprising:
a second dielectric layer over the first dielectric layer; and
a second conductive fill material that fills an opening through a thickness of the second dielectric layer, wherein the second conductive fill material contacts at least a portion of the first conductive fill material.

16. The electronic device of claim 15, wherein the second conductive fill material has a width that is greater than a width of the first conductive fill material.

17. The electronic device of claim 15, wherein the second conductive fill material contacts a portion of the capacitor dielectric layer on the top surface of the first dielectric layer.

18. The electronic device of claim 13, wherein the capacitor dielectric layer comprises a ferroelectric material.

19. The electronic device of claim 18, wherein the ferroelectric material comprises hafnium and at least one of silicon, lanthanum, nitrogen, aluminum, zirconium, germanium, or yttrium.

20. The electronic device of claim 13, wherein the second conductive layer extends above the opening.

21. A method of fabricating a capacitor, the method comprising:
depositing a dielectric layer over a substrate;
etching an opening through a thickness of the dielectric layer;
depositing a first conductive layer in the opening and on a top surface of the dielectric layer;
depositing a sacrificial material into the opening such that the sacrificial material fills a remainder of the opening;
removing a portion of the first conductive layer and a portion of the sacrificial material that is above a top surface of the dielectric layer;
removing the sacrificial material from within the opening;
depositing a capacitor dielectric layer in the opening and on a top surface of the dielectric layer;
depositing a second conductive layer in the opening and over a top surface of the dielectric layer;

depositing a conductive fill material into the opening such that the conductive fill material fills a remainder of the opening; and removing a portion of the second conductive layer and a portion of the conductive fill material that is above the top surface of the dielectric layer to provide the second conductive layer having an uppermost surface at a same level as an uppermost surface of the capacitor dielectric layer.

22. The method of claim 21, wherein the dielectric layer is a first dielectric layer, the opening is a first opening, and the conductive fill material is a first conductive fill material, the method further comprising:

depositing a second dielectric layer over the first dielectric layer;

etching a second opening through the second dielectric layer such that at least a portion of the first conductive fill material is exposed in the second opening; and depositing a second conductive fill material in the second opening.

23. The method of claim 22, wherein etching the second opening comprises etching the second opening having a width that is greater than a width of the first conductive fill material within the opening.

24. The method of claim 22, wherein etching the second opening comprises exposing a portion of the capacitor dielectric layer on the top surface of the first dielectric layer.

25. The method of claim 21, wherein removing the portion of the first conductive layer and the portion of the sacrificial material comprises using chemical mechanical polishing (CMP) to remove the portion of the first conductive layer and the portion of the sacrificial material.

* * * * *